United States Patent
Yamada et al.

(10) Patent No.: US 6,344,156 B1
(45) Date of Patent: *Feb. 5, 2002

(54) ANISOTROPIC CONDUCTIVE ADHESIVE FILM

(75) Inventors: Yukio Yamada; Mikio Sakairi; Yasushi Akutsu; Tomoyuki Ishimatsu, all of Tochigi (JP)

(73) Assignee: Sony Chemicals Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/460,389

(22) Filed: Dec. 13, 1999

(30) Foreign Application Priority Data

Dec. 25, 1998 (JP) ............................................ 10-369068

(51) Int. Cl.[7] .............................. H01B 1/22; B32B 7/00
(52) U.S. Cl. ........................ 252/512; 428/403; 428/407
(58) Field of Search ................................ 252/512, 513, 252/514; 428/323, 339, 356, 407, 403, 929

(56) References Cited

U.S. PATENT DOCUMENTS

| 4,740,657 A | * | 4/1988 | Tsukagoshi et al. | ...... 174/88 R |
| 5,336,443 A | * | 8/1994 | Odashima | ...... 252/511 |
| 6,034,331 A | * | 3/2000 | Tsukagoshi et al. | ...... 174/250 |

FOREIGN PATENT DOCUMENTS

JP      A-7-140480      6/1995

* cited by examiner

Primary Examiner—Mark Kopec
(74) Attorney, Agent, or Firm—Oliff & Berridge, PLC

(57) ABSTRACT

An anisotropic conductive adhesive film capable of maintaining a high connection reliability on connection electrodes with a fine pitch on which an oxide film is formed.

The anisotropic conductive adhesive film 1 comprises conductive particles 7 dispersed in an insulating binder 6. Each conductive particle 7 consists of a styrene resin particle 71 and a thin metal film 72 formed on the surface thereof by gold-plating, etc. Projections 72a are formed on the surface of the thin metal film 72 of the conductive particle 7.

15 Claims, 3 Drawing Sheets

The recovery ratio from 10% compressive deformation of the resin particle 71

ANISOTROPIC CONDUCTIVE ADHESIVE FILM

FIELD OF THE INVENTION

This invention relates to an anisotropic conductive adhesive film to be used in, for example, electrically connecting a liquid crystal display (LCD) to a circuit board.

BACKGROUND OF THE INVENTION

It has been a practice to connect, for example, a liquid crystal device to an integrated circuit board, etc. by using anisotropic conductive adhesive films.

These anisotropic conductive adhesive films are used in fixing and electrically connecting various terminals to each other, for example, in connecting the connection electrode of a tape carrier package (TCP) or an IC chip to a pattern electrode formed in the glass board of an LCD panel.

In general, an anisotropic conductive adhesive film comprises an insulating binder containing conductive particles As the conductive particles in this case, use is made of those obtained by forming a conductive thin film by for example, nickel- or gold-plating on the surface of particles made of metals (nickel, silver, etc.) or resins.

A fine pitch (pitch: about 60 $\mu$m) and a high connective reliability (about 1,000 hours at 85° C. under relative humidity of 85%) are required in connecting an LCD panel with the use of a wiring pattern made of aluminum (Al) or chromium (Cr) on which an oxide film is frequently formed on the surface of an electrode pattern.

However, these requirements cannot be satisfied by the prior art.

In the case of an anisotropic conductive adhesive film comprising conductive particles made of a metal (Ni, etc.), namely, electricity passes through an oxide film formed on an electrode pattern but a fine pitch cannot be established due to the irregular particle diameter of the metallic particles. In this case, there arises an additional problem that the small linear expansion coefficient, compared with that of the binder, brings about a low connective reliability after heat aging.

In the case of an anisotropic conductive adhesive film with the use of conductive particles obtained by metal-plating resin particles, on the other hand, a fine pitch can be established on a pattern electrode on which no oxide film is formed. However, such an anisotropic conductive adhesive film suffers from a problem of having a high initial resistance to a pattern electrode on which an oxide film is formed.

SUMMARY OF THE INVENTION

The present invention, which has been made to solve these problems encountered in the prior art, aims at providing an anisotropic conductive adhesive film capable of maintaining a high connective reliability on connection electrodes with a fine pitch on which an oxide film is formed.

The present inventors have conducted intensive studies to achieve the above-described object. As a result, they have successfully found out that connection electrodes with a fine pitch each having an oxide film can be surely connected to each other by forming specific projections on the surface of a conductive thin film of conductive particles consisting of resin particles and the conductive thin film formed thereon, thus completing the present invention.

According to a present invention, which has been completed based on the finding as described above, an anisotropic conductive adhesive film for electrically connecting terminals to each other comprises an insulating adhesive formed in a film, and conductive particles dispersed in an insulating adhesive, and consists of resin particles having a conductive thin film on the surface thereof and wherein projections are formed on the surface of the conductive thin film.

In the present invention, projections are formed on the surface of the conductive thin film on resin particles. Under pressure, therefore, the projections of the conductive thin film of the conductive particles break through the oxide films of connection electrodes and thus the connection electrodes can be surely connected electrically to each other.

On the other hand, conductive particles having resin particles as the core are used therein, which makes it possible to achieve a regular particle diameter. When the insulating binder is loosened between the connection electrodes after the aging, moreover, the contact of the projections of the conductive thin film with the connection electrodes can be maintained owing to the elastic rebound of the resin particles, thus ensuring a high conductive reliability.

As described above, the present invention makes it possible to provide an anisotropic conductive adhesive film capable of maintaining a high connective reliability on connection electrodes with a fine pitch on which an oxide film is formed.

In the present invention, it is effective that the resin particles have such a hardness as giving a K value at 10% compressive deformation of from $1\times10^2$ to $2\times10^3$ kgf/mm$^2$.

In the present invention, it is also effective that the resin particles have a recovery ratio from 10% compressive deformation of 5% or above.

In the present invention, it is also effective that the conductive thin film has a compressive elastic modulus of $1.5\times10^4$ kgf/mm$^2$ or above.

When the hardness and the recovery ratio of the resin particles are defined each within a specific range, or the compressive elastic modulus of the conductive thin film is set to a level sufficiently higher than the hardness of the resin particles, the projection can break through the oxide film of the pattern electrode due to the elastic rebound of the resin particles caused by the compressive deformation under pressure. Thus, the connection electrodes can be surely connected to each other via these conductive particles.

In the present invention, it is also effective that 4 to 300, on average, projections are formed on the surface of the conductive thin film.

When 4 to 300 projections are formed on the conductive film, the conductive particles breaking through the oxide film can come into contact with the connective electrodes in a sufficiently large contact area and thus the electrodes can be satisfactorily connected to each other.

In the present invention, it is also effective that the content of the conductive particles is from 1 to 5% by volume.

According to the present invention, the connection electrodes can be more surely connected to each other via the conductive particles.

In the present invention, it is further effective that an insulation layer is formed on the surface of the conductive thin film of the conductive particles.

The constitution according to the present invention makes it possible to prevent electrical short circuit among the conductive particles, even though the conductive particles are used in a rather large amount and condense together.

These and other objects of the invention will become more apparent in the detailed description and examples which follow.

DETAILED DESCRIPTION OF THE INVENTION

Figure 1A:
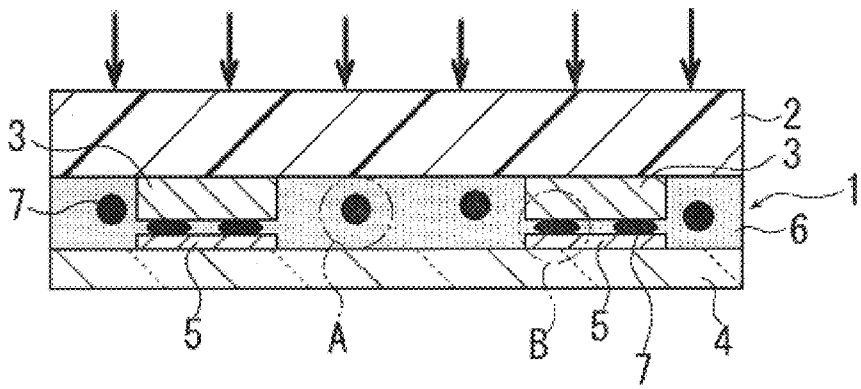
FIG. 1(a) is an illustration showing the constitution of an embodiment of the anisotropic conductive adhesive film according to the present invention which has been subjected to heat compression bonding.
Figure 1B:
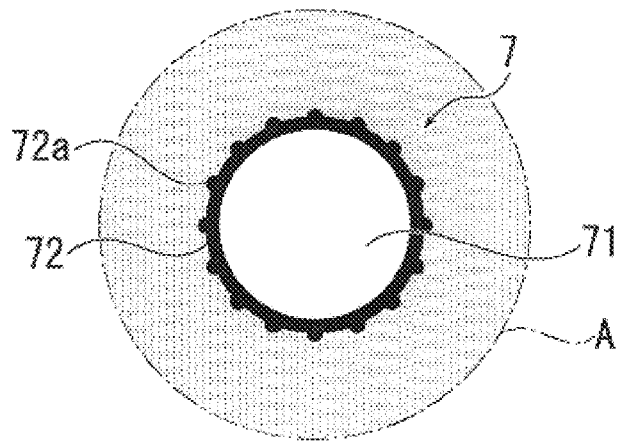
FIG. 1(b) is an enlarged view of the part surrounded by chain line A.
Figure 1C:
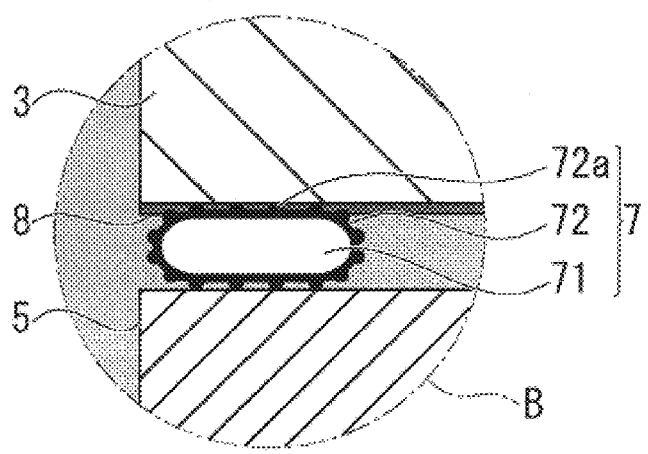
FIG. 1(c) is an enlarged view of the part surrounded by chain line B.

FIG. 1(a) to FIG. 1(c) are illustrations showing a preferable embodiment of the anisotropic conductive adhesive film according to the present invention, wherein FIG. 1(a) shows the constitution thereof after heat compression bonding, FIG. 1(b) is an enlarged view of the part surrounded by chain line A, and FIG. 1(c) is an enlarged view of the part surrounded by chain line B.

Figure 2:
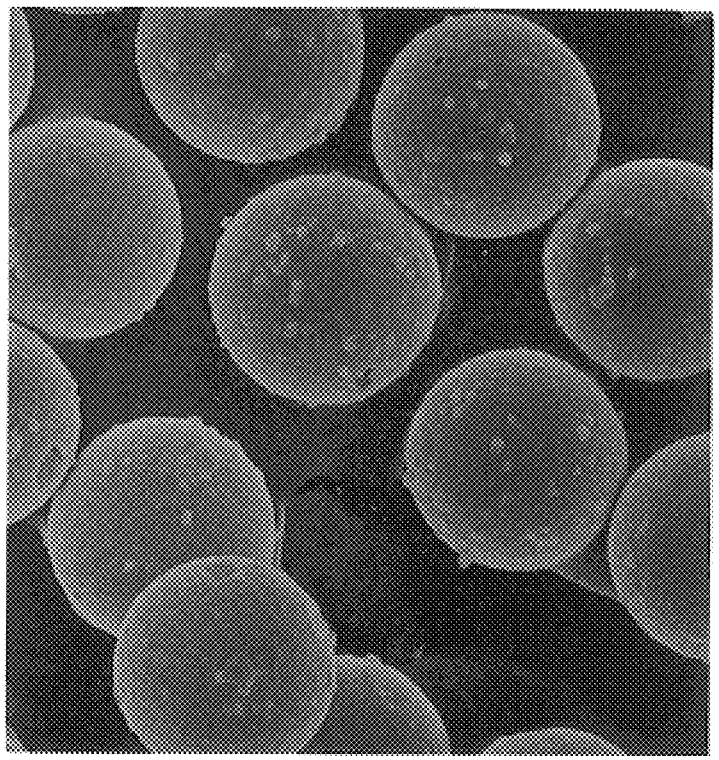
FIG. 2 is an example of electron microscopic photographs (5,000× magnification) showing the particle structure of the conductive particles to be used in the present invention.

FIG. 2 is an example of electron microscopic photographs (5,000× magnification) showing the structure of the conductive particles to be used in the present invention.

As FIG. 1 shows, the anisotropic conductive adhesive film 1 of the present invention, which is to be used in, for example, connecting electrodes 3 of a circuit board 2 to electrodes 5 of a glass panel 4, comprises conductive particles 7 dispersed in a filmy insulating binder resin (insulating binder) 6. The electrodes 3 of the circuit board 2 adjacent to each other have a pitch of about 60 μm.

In this embodiment, an oxide film 8 is formed on the surface of the electrode 3 of the circuit board 2, as shown in FIG. 1(c).

In the present invention, use can be made, as the insulating binder resin 6, of those containing epoxy resins as the main component together with coupling agents, curing agents, etc.

This anisotropic conductive adhesive film 1 is formed on a separate film made of, for example, polyethylene terephthalate (PET) and the surface of the anisotropic conductive adhesive film 1 may be covered, if necessary, with a cover film, though not shown in the figure.

As the conductive particles 7, on the other hand, use is made of those obtained by coating a resin particle 71 with a thin metal film (a conductive thin film) 72 and forming projections 72a on the surface of the thin metal film 72, as will be described hereinafter.

As the resin particles 71, it is possible to use those made of resins such as epoxy resin, phenolic resin, acrylic resin, acrylonitrile/styrene (AS) resin, benzoguanamine resin, divinyl benzene resin, styrene resin, etc.

From the viewpoint of ensuring the adequate conductive reliability, the average particle diameter of the resin particles 71 preferably ranges from 2 to 10 μm, more preferably from 3 to 8 μm. To ensure the adequate conductive reliability too, it is preferable that the dispersion in the particle diameter of the resin particles 71 falls within a range of ±2 μm.

It is preferable that the resin particles 71 have such a hardness as giving a K value at 10% compressive deformation of from 100 to 2,000 kgf/mm² (1 kgf/mm²=9.80665 MPa), more preferably from 200 to 1,500 kgf/mm².

When the K value at 10% compressive deformation of the hi resin particles 71 is less than 100 kgf/mm², the resin particles 71 are largely deformed under pressure and thus the projections 72a of the thin metal film 72 cannot adequately break through the oxide film, thus resulting in a problem that the conductive resistance is elevated. When the K value thereof exceeds 2,000 kgf/mm², on the other hand, the resin particles 71 cannot be adequately deformed so as to fail to make up for the dispersion in the thickness of the electrode terminals. In this case, there arise additional problems such as a high pressure being required in the pressuring step, the enlarged elastic rebound among the conductive particles causing interfacial separation, etc.

Further, it is preferable that the resin particles 71 have a recovery ratio from 10% compressive deformation of 5% or above, more preferably 7% or above.

When the recovery ratio of the resin particles 71 is less than 5%, the resin particles 71 in the deformed state cannot exhibit a sufficient elastic rebound. Thus, these resin particles 71 cannot follow up the displacement of the insulating binder resin 6, etc., which results in a problem that the conductive resistance is elevated.

The K value at 10% compressive deformation of the resin particles 71 is determined from the relationship between the compressive displacement and the compressive load on the resin particles 71 at 10% compressive deformation among the relationships between the compressive displacement and the compressive load on the resin particles 71.

Namely, the K value can be expressed on following equation.

K value=$2.8P/\pi d^2$(kgf/mm²)

P: The load at 10% compressive deformation of the resin particles 71 d: The mean diameter of the resin particle 71

Figure 3A:
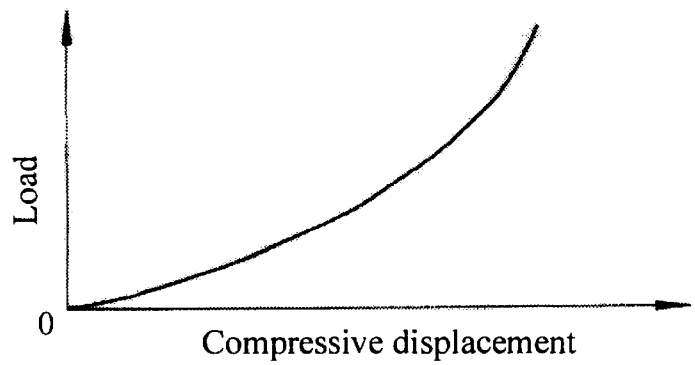
FIGS. 3(a) and 3(b) are graphs showing a relationship between load and compressive displacement.
Figure 3B:
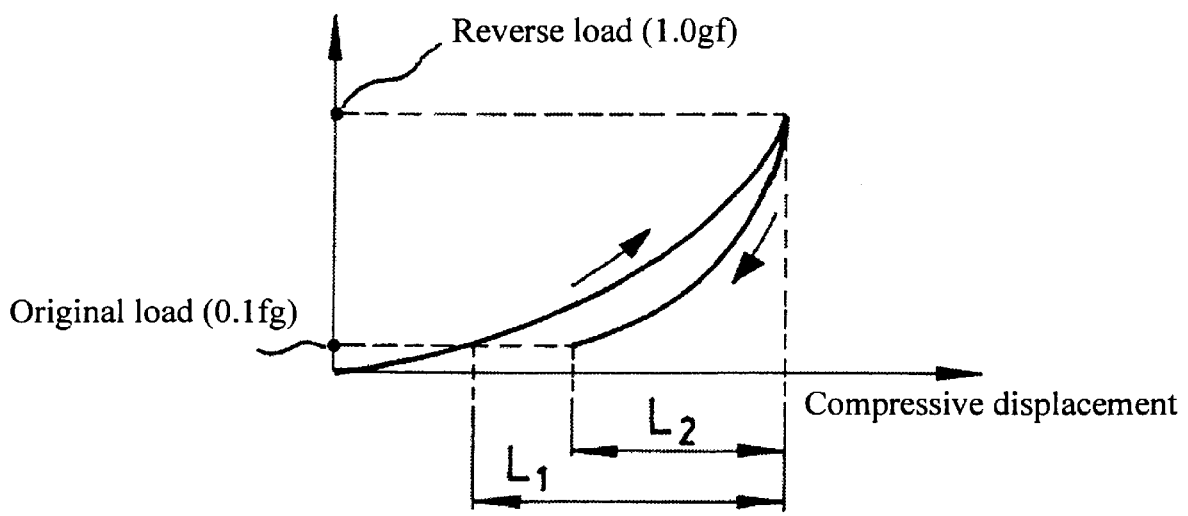

As illustrated en FIGS. 3(a) and 3(b), the recovery ratio from 10% compressive deformation of the resin particles 71 is defined as the ratio (percentage) of the displacement($L_1$) of the resin particles 71 caused by compressing the resin particles 71 from the original load (0.1 gf) to the reverse load (1.0 gf) and the displacement ($L_2$) thereof caused by relieving the load from the reverse load (1.0 gf) to the original load (0.1 gf).

Namely, the recovery ratio(R) can be expressed in following equation.

R(recovery ratio)=$(L_1/L_2) \times 100(\%)$

In the present invention, the thin metal film 72 is formed on the surface of the resin particles 71 by, for example, electrolessly plating. In this step, nickel, gold, etc. can be used as the material for forming the thin metal film 72.

It is preferable that the thin metal film 72 has a compressive elastic modulus of $1.5 \times 10^4$ kgf/mm² or above, more preferably $2.0 \times 10^4$ kgf/mm² or above on 10% compressive deformation.

When the compressive elastic modulus of the thin metal film 72 is less than $1.5 \times 10^4$ kgf/mm², there arises a problem that projections 72a of the thin metal film 72 are deformed under pressure and thus cannot adequately break through the oxide film 8.

In the present embodiment of the invention, the projections 72a on the surface of the thin metal film 72 can be formed by, for example, changing the treatment temperature in the step of the electroless plating so as to change the reaction speed of nickel, etc.

The height of the projections 72a of the thin metal film 72 preferably ranges from 0.01 to 3 μm, more preferably from 0.1 to 1.1 μm.

When the height of the projections 72a of the thin metal film 72 is less than 0.01 μm, there arises a problem that the projections 72a of the thin metal film 72 cannot break through the oxide film 8 and thus fail to reach the electrodes 3 of the circuit board 2, thereby achieving only insufficient connection of the electrodes 3 and 5. When the height thereof exceeds 3 μm, on the other hand, the projections 72a can be formed only in a small number and thus the contact between the conductive particles 7 and the electrodes 3 becomes insufficient. In this case, only insufficient connection of the electrodes 3 and 5 can be achieved too.

It is preferable that 4 to 300, more preferably 4 to 200, on average, projections 72a are formed on the surface of the thin metal film 72.

When the number of the projections 72a of the thin metal film 72 is less than 4, the projections 72a break through the oxide film 8 and come in contact with the electrodes 3 only in a small contact area. As a result, there arises a problem that adequate connection between the electrodes 3 and 5 cannot be ensured. When 300 or more projections 72a are provided, on the other hand, the projections 72a of the thin metal film 72 condense together, which makes the thickness of the thin metal film 72 irregular.

The content of the conductive particles 7 having the above-described constitution preferably ranges from 1 to 15% by volume, more preferably from 2 to 15% by volume.

When the content of the conductive particles 7 is less than 1% by volume, there arises a problem that the connection between the electrodes 3 and 5 is not ensured and thus the conductive resistance is elevated. When the content thereof exceeds 15% by volume, on the other hand, there arises another problem that the conductive particles 7 condense together and thus the insulation resistance between the electrodes 3 and 5 adjacent to each other is lowered.

When the content of the conductive particles 7 is from 5 to 15% by volume, on the other hand, it is favorable to form an insulation layer on the surface of the thin metal film 72 of the conductive particles 7.

The anisotropic conductive adhesive film 1 according to the present invention is produced in the following manner. First, conductive particles 7 dispersed in a solvent are added to a solution in which a definite epoxy resin is dissolved and mixed to give a binder paste.

Next, this binder paste is applied onto a separate film such as a polyester film and dried. Then a cover film is laminated thereon to give the anisotropic conductive adhesive film 1.

The electrodes 3 and 5 can be connected to each other by using the anisotropic conductive adhesive film 1 of the present invention by, for example, the following method. The anisotropic conductive adhesive film 1 is adhered to the surface of the glass panel 4. And the glass panel 4 followed by registration and temporal tacking to the circuit board 2. Next, heat compression bonding is carried out at definite temperature and pressure as shown in FIG. 1(a). Thus, the insulating binder resin 6 is hardened while electrically connecting the electrodes 5 of the glass panel 4 to the electrodes 3 of the circuit board 2.

In the present invention, the projections 72a of the thin metal film 72 break through the oxide film 8, due to the elastic rebound of the resin particles 71, and thus come into contact with the electrodes 3 of the circuit board 2 in the step of heat compression bonding, as FIG. 1(c) shows. Thus, the electrodes 3 of the circuit board 2 are electrically connected to the electrodes 5 of the glass panel 4 via the thin metal film 72 of the conductive particles 7.

As a result, a high connective reliability on the electrodes 3 arranged with a fine pitch can be maintained even in the case where an oxide film 8 is formed on the electrodes 3.

Furthermore, the electrodes 3 of the circuit board 2 can be connected surely to the electrodes 5 of the glass panel 4 and thus a high connective reliability can be established by appropriately controlling the hardness of the resin particles 7, the compressive modules of the thin metal film 72, the number and height of the projections 72a formed on the surface of the thin metal film 72 and the content of the conductive particles 7.

When the conductive particles 7 are used in an amount of from 5 to 15% by volume, the thin metal film 72 may be coated with an insulation layer. Thus, it becomes possible to prevent electrical short circuit among the conductive particles 7, even though the conductive particles condense together, thereby maintaining a high connective reliability.

Now, the anisotropic conductive adhesive film according to the present invention will be described in greater detail by reference to the following Examples and Comparative Examples.

EXAMPLE 1

First, an insulating binder resin solution (solid content: 50%) was prepared by dissolving 48% by weight of a solid bisphenol A-type epoxy resin (EP1009™ manufactured by Yuka-Shell), 50% by weight of an imidazole-based curing agent (HX3941HP™ manufactured by Asahi Chemical Industry Co., Ltd.) and 2.0% by weight of a silane coupling agent (A187™ manufactured by Nippon Unicar Co., Ltd.) in toluene employed as a solvent.

To the obtained binder solution were added nickel-gold-plated benzoguanamine particles as conductive particles to give a binder paste containing 8% by volume of the conductive particles.

These benzoguanamine particles had an average diameter of 5 μm and that the dispersion in the particle diameter fell within a range of ±1 μm. The benzoguanamine particles showed such a hardness as giving a K value at 10% compressive deformation of 800 kgf/mm² and a recovery ratio from 10% compressive deformation of 10%.

As FIG. 2 shows, the plated conductive particles were photographed under an electron microscope (5,000× magnification) and the projections formed on the surface of the thin metal film of each conductive particles were counted by using the photograph. In this method, the projections formed on a hemisphere were counted and twice as much the obtained value was referred to as the number of the projections. The projections on 5 conductive particles were counted and the average thereof was referred to as the observed value. In this Example, 19.6 projections were observed on average.

On the surface of the thin metal film of the conductive particles, an insulation layer (thickness: 0.1 to 1 μm) was formed by the known hybridization treatment with the use of acryl/styrene particles having an average particle diameter of 1 μm.

Then the binder paste as described above was applied onto a separate PET film so as to give a thickness of 25 μm after drying thereby giving an anisotropic conductive adhesive film. This anisotropic conductive adhesive film was cut into slits and used as the sample of Example 1.

EXAMPLE 2

An anisotropic conductive adhesive film sample was produced as in Example 1 but using conductive particles having 25.6 projections on average, adjusting the content thereof to 2.5% by volume and forming no insulation layer on the surface of the conductive particles.

EXAMPLE 3

An anisotropic conductive adhesive film sample was produced as in Example 2 but using conductive particles having 20 projections on average.

EXAMPLE 4

An anisotropic conductive adhesive film sample was produced as in Example 2 but using nickel-plated resin particles having 25.6 projections on average as the conductive particles.

EXAMPLE 5

An anisotropic conductive adhesive film sample was produced as in Example 2 but using conductive particles having acrylonitrile/styrene particles as the core, which showed a K value at 10% compressive deformation of 480 kgf/mm$^2$ and a recovery ratio from 10% compressive deformation of 30%, and having 26 projections on average.

EXAMPLE 6

An anisotropic conductive adhesive film sample was produced as in Example 2 but using conductive particles having resin particles as the core, the dispersion in the particle diameter of which fell within a range of ±2 μm, and having 26 projections on average.

EXAMPLE 7

An anisotropic conductive adhesive film sample was produced as in Example 2 but using conductive particles having an average diameter of 3 μm and having 20 projections on average.

EXAMPLE 8

An anisotropic conductive adhesive film sample was produced as in Example 2 but forming an insulation layer on the surface of the conductive particles by the same method as in Example 1 and employing the conductive particles and adjusting the content thereof to 8% by volume.

These conductive particles had 25.6 projections on average similar to Example 2.

EXAMPLE 9

An anisotropic conductive adhesive film sample was produced as in Example 8 but using conductive particles having 25.6 projections on average and adjusting the content thereof to 15% by volume.

These conductive particles had 25.6 projections on average similar to Example 2.

COMPARATIVE EXAMPLE 1

An anisotropic conductive adhesive film sample was produced as in Example 2 but using conductive particles having styrene particles (degree of crosslinking: 5%) as the core, which showed a K value at 10% compressive deformation of 400 kgf/mm$^2$ and a recovery ratio from 10% compressive deformation of 0%, and having 26 projections on average.

COMPARATIVE EXAMPLE 2

An anisotropic conductive adhesive film sample was produced as in Example 2 but using conductive particles having 0.8 projections on average.

COMPARATIVE EXAMPLE 3

An anisotropic conductive adhesive film sample was produced as in Example 2 but using conductive particles showing the dispersion in the particle diameter of ±3 μm and having 26 projections on average.

COMPARATIVE EXAMPLE 4

An anisotropic conductive adhesive film sample was produced as in Example 2 but using conductive particles having styrene particles (degree of crosslinking: 1%) as the core, which showed a K value at 10% compressive deformation of 80 kgf/mm$^2$ and a recovery ratio from 10% compressive deformation of 0%, and having 30 projections on average.

COMPARATIVE EXAMPLE 5

An anisotropic conductive adhesive film sample was produced as in Example 2 but using conductive particles having an average diameter of 2 μm and having 18 projections on average.

COMPARATIVE EXAMPLE 6

An anisotropic conductive adhesive film sample was produced as in Example 2 but using as the conductive particles gold-plated nickel particles having no projection on the surface.

COMPARATIVE EXAMPLE 7

An anisotropic conductive adhesive film sample was produced as in Example 1 but using conductive particles having no insulation layer on the surface and adjusting the content thereof to 0.5% by volume.

The conductive particles had 19.6 projections on average similar to Example 1.

COMPARATIVE EXAMPLE 8

An anisotropic conductive adhesive film sample was produced as in Example 1 but adjusting the content of the conductive particles to 20% by volume.

The conductive particles had 19.6 projections on average similar to Example 1.

COMPARATIVE EXAMPLE 9

An anisotropic conductive adhesive film sample was produced as in Example 1 but using conductive particles having no insulation layer on the surface.

The conductive particles had 19.6 projections on average similar to Example 1.

COMPARATIVE EXAMPLE 10

An anisotropic conductive adhesive film sample was produced as in Example 2 but using conductive particles having 8 projections on average.

<Evaluation Data>
Conductive resistance:

By using each of the above samples, a circuit board was compression bonded to a glass board and the conductive resistance was evaluated. As the circuit board in this case, use was made of a TCP prepared by forming an electrode pattern with a pitch of 50 μm, wherein a copper foil of 15 μm in thickness was nickel/gold-plated, on exclusively one face of a base board of 75 μm in thickness made of polyimide (UPIREX™ manufactured by Ube Industries, Ltd.). The width of the contact part (top width) of each electrode pattern was adjusted to 13 μm.

As the glass board, on the other hand, use was made of a test element group (TEG) formed by metallizing aluminum electrodes (thickness: 0.5 μm) on the whole face of a glass plate of 0.7 mm in thickness.

The compression bonding was performed at 170° C. under 40 kgf/cm² for 10 seconds. By using the above-described sample, the circuit board and the glass board were compression bonded in a width of 1 mm and then the conductive resistance between patterns adjacent to each other was measured. Table 1 shows the results.

In this evaluation, a sample showing a conductive resistance less than 1 Ω was regarded as good (○), one showing a conductive resistance of 1 to 2 Ω was regarded as somewhat poor (Δ), and one showing a conductive resistance more than 2 Ω was regarded as poor (X).

Insulation resistance:

By using each of the above samples, a glass plate having a thickness of 0.7 mm and a surface insulation resistance of $1\times10^{15}$ Ω or above was connected by compression bonding (connection width: 1 mm) to the TCP as described above at 170° C. under 40 kgf/cm² for 10 seconds. Then a potential of 25V was applied between electrode patterns adjacent to each other and the insulation resistance was measured. Table 1 shows the results.

In this evaluation, a sample showing an insulation resistance more than $1\times10^{10}$ Ω was regarded as good (○), one showing an insulation resistance of $1\times10^{8}$ to $1\times10^{10}$ Ω was regarded as somewhat poor (Δ), and one showing an insulation resistance less than $1\times10^{8}$ Ω was regarded as poor (X).

Conductive Reliability:

The glass board and the TCP, which had been compression-bonded to each other, employed in the insulation resistance test were aged at 85° C. under a relative humidity of 85% for 1,000 hours. Then a potential of 25V was applied between electrode patterns adjacent to each other and the resistance was measured. Table 1 shows the results.

In this evaluation, a sample showing a resistance more than $1\times10^{10}$ Ω was regarded as being good in conductive reliability (○), one showing a resistance of $1\times10^{8}$ to $1\times10^{10}$ Ω was regarded as somewhat poor (Δ), and one showing a resistance less than $1\times10^{8}$ Ω was regarded as poor (X).

TABLE 1

Evaluation data of invention samples and comparative samples

| | Base | Particle diameter (μm) | Scattering in particle diameter (μm) | Compressive elastic modulus (kgf/mm²) | Recovery ratio (%) | Plating | No. of Projection | Content (vol %) | Insulation layer | Conductive resistance | Insulation resistance | After aging |
|---|---|---|---|---|---|---|---|---|---|---|---|---|
| ex. 1 | benzo-guanamine | 5 | ±1 | 800 | 10 | nickel/gold | 19.6 | 8.0 | Yes | ○ | ○ | ○ |
| ex. 2 | benzo-guanamine | 5 | ±1 | 800 | 10 | nickel/gold | 25.6 | 2.5 | No | ○ | ○ | ○ |
| ex. 3 | benzo-guanamine | 5 | ±1 | 800 | 10 | nickel/gold | 20.0 | 2.5 | No | ○ | ○ | ○ |
| ex. 4 | benzo-guanamine | 5 | ±1 | 800 | 10 | nickel/gold | 25.6 | 2.5 | No | ○ | ○ | ○ |
| ex. 5 | acrylonitrile/stylene | 5 | ±1 | 480 | 30 | nickel | 26.0 | 2.5 | No | ○ | ○ | ○ |
| ex. 6 | benzo-guanamine | 5 | ±2 | 800 | 10 | nickel/gold | 26.0 | 2.5 | No | ○ | ○ | ○ |
| ex. 7 | benzo-guanamine | 3 | ±1 | 800 | 10 | nickel/gold | 20.0 | 2.5 | No | ○ | ○ | ○ |
| ex. 8 | benzo-guanamine | 5 | ±1 | 800 | 10 | nickel/gold | 25.6 | 8.0 | Yes | ○ | ○ | ○ |
| ex. 9 | benzo-guanamine | 5 | ±1 | 800 | 10 | nickel/gold | 25.6 | 15.0 | Yes | ○ | ○ | ○ |
| com. ex. 1 | stylene | 5 | ±1 | 400 | 0 | nickel/gold | 26.0 | 2.5 | No | Δ | ○ | X |
| com. ex. 2 | benzo-guanamine | 5 | ±1 | 800 | 10 | nickel/gold | 0.8 | 2.5 | No | Δ | ○ | X |
| com. ex. 3 | benzo-guanamine | 5 | ±3 | 800 | 10 | nickel/gold | 26.0 | 2.5 | No | Δ | Δ | Δ |
| com. ex. 4 | stylene | 5 | ±1 | 80 | 0 | nickel/gold | 30.0 | 2.5 | No | Δ | ○ | Δ |
| com. ex. 5 | benzo-guanamine | 2 | ±1 | 800 | 10 | nickel/gold | 18.0 | 2.5 | No | Δ | ○ | Δ |
| com. ex. 6 | nickel | 5 | ±1 | — | — | gold | — | 2.5 | No | ○ | ○ | X |
| com. ex. 7 | benzo-guanamine | 5 | ±1 | 800 | 10 | nickel/gold | 19.6 | 0.5 | No | Δ | ○ | Δ |
| com. ex. 8 | benzo-guanamine | 5 | ±1 | 800 | 10 | nickel/gold | 19.6 | 20.0 | Yes | ○ | Δ | ○ |
| com. ex. 9 | benzo-guanamine | 5 | ±1 | 800 | 10 | nickel/gold | 19.6 | 8.0 | No | ○ | Δ | ○ |
| com. ex. 10 | benzo-guanamine | 5 | ±1 | 800 | 10 | nickel/gold | 8.0 | 2.5 | No | Δ | ○ | X |

[Conductive resistance] ○: good, Δ: somewhat poor; and X: poor
[Insulation resistance] ○: good, Δ: somewhat poor; and X: poor
[Conductive reliability after aging] ○: good, Δ: somewhat poor, and X: poor As Table 1 shows, when the K value at 10% compressive deformation and the recovery ratio therefrom of resin particles were changed as in Examples 2 and 5 and Comparative Examples 1 and 4, the samples of Examples 2 and 5 showed favorable data in all of the items examined, while the sample of Comparative Example 4 having a low compressive elastic modulus (80 kgf/mm$^2$) showed a somewhat poor conductive resistance and a somewhat poor conductive reliability after aging.

The sample of Comparative Example 1 having a low recovery ratio from 10% compressive deformation (0%) showed a somewhat poor conductive resistance and a poor conductive reliability after aging.

The sample of Comparative Example 6 with the use of nickel particles as the conductive particles (compressive elastic modulus 2.1×10$^4$ kgf/mm$^2$, recovery ratio 0%) showed a poor conductive reliability after aging.

When the number of projections of conductive particles were changed as in Examples 1 to 7 and Comparative Examples 2 and 10, the samples having 8 or less projections on a conductive particles showed each a somewhat poor conductive resistance and a poor conductive reliability after aging (Comparative Examples 2 and 10).

When the contents of the conductive particles were varied in the presence or absence of the insulation layer as in Examples 1, 2, 8 and 9 and Comparative Examples 7, 8 and 9, the sample containing an excessively small amount (0.5% by volume) of the conductive particles showed a somewhat poor conductive resistance and a somewhat poor conductive reliability after aging (Comparative Example 7).

When the conductive particles were employed in an amount of 8% by volume, on the other hand, the samples provided with the insulation layer (Examples 1 and 8) showed favorable data in all of the items tested, while the sample having no insulation layer (Comparative Example 9) showed a lowered insulation resistance.

The sample of Example 9 containing 15% by volume of the conductive particles and provided with the insulation layer, favorable data were obtained in all of the items examined. When the content of the conductive particles was increased to 20% by volume (Comparative Example 8), the insulation resistance was lowered.

As described above, the present invention makes it possible to provide an anisotropic conductive adhesive film capable of maintaining a high connective reliability on connection electrodes with a fine pitch on which an oxide film is formed.

What is claimed is:

1. An anisotropic conductive adhesive film for electrically connecting terminals to each other which comprises:

an insulating adhesive formed in a film; and conductive particles being dispersed in said insulating adhesive and consisting of resin particles having a conductive thin film on the surface thereof wherein projections are formed on the surface of said conductive thin film and said conductive thin film is formed by electroless plating, wherein said resin particles have such a hardness as giving a K value at 10% compressive deformation of from 1×10$^2$ to 2×10$^3$ kgf/mm$^2$.

2. The anisotropic conductive adhesive film as claimed in claim 1, wherein said resin particles have a recovery ratio from 10% compressive deformation of 5% or above.

3. The anisotropic conductive adhesive film as claimed in claim 2, wherein said conductive thin film has a compressive elastic modulus of 1.5×10$^4$ kgf/mm$^2$ or above.

4. The anisotropic conductive adhesive film as claimed in claim 1, wherein said conductive thin film has a compressive elastic modulus of 1.5×10$^4$ kgf/mm$^2$ or above.

5. The anisotropic conductive adhesive film as claimed in claim 1, wherein said projections formed on the surface of said conductive thin film are 0.01 to 3 μm in height.

6. The anisotropic conductive adhesive film as claimed in claim 1, wherein 4 to 300, on average, projections are formed on the surface of said conductive thin film.

7. The anisotropic conductive adhesive film as claimed in claim 1, wherein the content of said conductive particles is from 1 to 15% by volume.

8. The anisotropic conductive adhesive film as claimed in claim 1, wherein an insulation layer is formed on the surface of the conductive thin film of said conductive particles.

9. The anisotropic conductive adhesive film as claimed in claim 1, wherein said resin particles have a recovery ratio from 10% compressive deformation of 5% or above.

10. The anisotropic conductive adhesive film as claimed in claim 1, wherein said conductive thin film has a compressive elastic modulus of 1.5×10$^4$ kgf/mm$^2$ or above.

11. An anisotropic conductive adhesive film for electrically connecting terminals to each other which comprises:

an insulating adhesive formed in a film; and conductive particles being dispersed in said insulating adhesive and consisting of resin particles having a conductive thin film on the surface thereof wherein projections are formed on the surface of said conductive thin film and said conductive thin film is formed by electroless plating;

wherein said resin particles have such a hardness as giving a K value at 10% compressive deformation of from 1×10$^2$ to 2×10$^3$ kgf/mm$^2$, said resin particles have a recovery ratio from 10% compressive deformation of 5% or above, and said conductive thin film has a compressive elastic modulus of 1.5×10$^4$ kgf/mm$^2$ or above.

12. The anisotropic conductive adhesive film as claimed in claim 11, wherein said projections formed on the surface of said conductive thin film are 0.01 to 3 μm in height.

13. The anisotropic conductive adhesive film as claimed in claim 11, wherein 4 to 300, on average, projections are formed on the surface of said conductive thin film.

14. The anisotropic conductive adhesive film as claimed in claim 11, wherein the content of said conductive particles is from 1 to 15% by volume.

15. The anisotropic conductive adhesive film as claimed in claim 11, wherein an insulation layer is formed on the surface of the conductive thin film of said conductive particles.

* * * * *